United States Patent
Xiao et al.

(10) Patent No.: US 7,960,205 B2
(45) Date of Patent: Jun. 14, 2011

(54) TELLURIUM PRECURSORS FOR GST FILMS IN AN ALD OR CVD PROCESS

(75) Inventors: Manchao Xiao, San Diego, CA (US); Liu Yang, Yorba Linda, CA (US); Thomas Richard Gaffney, Carlsbad, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 268 days.

(21) Appl. No.: 12/272,886

(22) Filed: Nov. 18, 2008

(65) Prior Publication Data
US 2009/0137100 A1 May 28, 2009

Related U.S. Application Data

(60) Provisional application No. 60/990,386, filed on Nov. 27, 2007.

(51) Int. Cl.
*H01L 21/00* (2006.01)
(52) U.S. Cl. .............. 438/95; 438/99; 438/102; 257/40; 257/E21.068
(58) Field of Classification Search .................... 438/95, 438/93, 99, 102; 257/40, E21.068
See application file for complete search history.

(56) References Cited

U.S. PATENT DOCUMENTS

| | | | |
|---|---|---|---|
| 3,058,802 A | 10/1962 | Kulifay | |
| 4,946,994 A | 8/1990 | Higa | |
| 5,035,874 A | 7/1991 | Higa et al. | |
| 5,043,476 A | 8/1991 | Higa et al. | |
| 5,312,983 A | 5/1994 | Brown et al. | |
| 7,105,870 B2 | 9/2006 | Lee et al. | |
| 7,518,007 B2 * | 4/2009 | Seo et al. | 556/12 |
| 7,727,884 B2 * | 6/2010 | Bae et al. | 438/631 |
| 2006/0039192 A1 | 2/2006 | Ha et al. | |
| 2006/0049447 A1 | 3/2006 | Lee et al. | |
| 2006/0072370 A1 | 4/2006 | Kuh et al. | |
| 2006/0172083 A1 | 8/2006 | Lee et al. | |
| 2006/0180811 A1 * | 8/2006 | Lee et al. | 257/40 |
| 2007/0054475 A1 | 3/2007 | Lee et al. | |
| 2009/0305458 A1 * | 12/2009 | Hunks et al. | 438/102 |

FOREIGN PATENT DOCUMENTS

| | | |
|---|---|---|
| EP | 0140625 B1 | 6/1988 |
| GB | 2148945 A | 6/1985 |

OTHER PUBLICATIONS

Michael R. Detty et al, Bis(trialkylsilyl) Chalcogenides. 1. Preparation and Reduction of Group 6A Oxides, J. Org. Chem. 1982, 47, pp. 1354-1356.

Bashir O. Dabbousi et al, (Me3Si)3SiTeH: Preparation, Characterization, and Synthetic Utility of a Remarkably Stable Tellurol, J. Am. Chem. Soc. 1991, 113, pp. 3186-3188.

Thomas J. Groshens et al, Room-Temperature MOCVD of Sb2Te3 Films and Solution Precipitation of M2Te3 . . . , Chem. Mater. 1994, 6, pp. 727-729.

M.N. Bochkarev et al, Organometallic(metalloidal) chalcogenides, Zhurnal Obshchei Khimii 1969, 39(1), pp. 135-141.

Hans Buerger et al, Disilyltelluride, Inorg. and Nuclear Chem. Letters 1967, 3 (12), pp. 549-552.

Groshens, et al; "Low Temperature MOCVD Growth of V/VI Materials Via A Me3SiNMe2 Elimination Reaction"; Thermoelectrics, Fifteenth International Conference on Pasadena, CA; 1996; pp. 430-434.

Degroot, M., et al; "Imine-Stabilized Zinc Trimethylsilylchalcogenolates: Powerful Reagents for the Synthesis of II-II'-VI Nanocluster Materials"; Angew. Chem. Ind. Ed. 2004; pp. 5355-5357.

* cited by examiner

*Primary Examiner* — Hsien-ming Lee
(74) *Attorney, Agent, or Firm* — Lina Yang

(57) ABSTRACT

The present invention is a process of making a germanium-antimony-tellurium alloy film using a process selected from the group consisting of atomic layer deposition and chemical vapor deposition, wherein a silyltellurium precursor is used as a source of tellurium for the alloy film and is reacted with an alcohol during the deposition process.

17 Claims, 2 Drawing Sheets

TELLURIUM PRECURSORS FOR GST FILMS IN AN ALD OR CVD PROCESS

CROSS REFERENCE TO RELATED APPLICATIONS

The present patent application claims the benefit of U.S. Provisional Patent Application Ser. No. 60/990,386 filed 27 Nov. 2007.

BACKGROUND OF THE INVENTION

As an emerging technology, phase change materials attracted more and more interest for its applications in manufacturing a new type of highly intergrated nonvolatile memory devices, phase change random access memory (PRAM). PRAM uses the unique behavior of chalcogenide glass, which can be "switched" between two states, crystalline and amorphous, with the application of heat. The crystalline and amorphous states of chalcogenide glass have dramatically different electrical resistivity, and this forms the basis by which data are stored. The amorphous, high resistance state is used to represent a binary 0, and the crystalline, low resistance state represents a 1.

Although PRAM has not yet reached the commercialization stage for consumer electronic devices, nearly all prototype devices make use of a chalcogenide alloy of germanium, antimony and tellurium (GeSbTe) called GST. The stoichiometry or Ge:Sb:Te element ratio is 2:2:5. When GST is heated to a high temperature (over 600° C.), its chalcogenide crystallinity is lost. Once cooled, it is frozen into an amorphous glass-like state and its electrical resistance is high. By heating the chalcogenide to a temperature above its crystallization point, but below the melting point, it will transform into a crystalline state with a much lower resistance.

One of the technical hurdles in designing PRAM cell is that in order to overcome the heat dissipation during the switching GST materials from crystalline to amorphous states at certain temperature, a high level of reset current needs to be applied. This heat dissipation can be greatly reduced by confining GST material into contact plugs. This would reduce the reset current needed for the action. Such a design, however, presents challenges for the techniques to form thin layer of GST materials. Since a plug structure is a high aspect ratio one, the conventional deposition method for GST films, or sputtering technique, due to its line-of-sight effect, has been found difficult to fill the plugs or high aspect ratio holes with GST materials. On the other hand, deposition techniques based on chemical reactions such as chemical vapor deposition (CVD) rely on transport and reaction of chemical vapors and do not have the line-of-sight effect. These techniques are better fits for such applications. In particular, the atomic layer deposition (ALD) can produce films with high conformality and chemical composition uniformity. Another technique in between ALD and CVD is so called cyclic CVD that may can be used for such applications.

To form a Ge—Sb—Te film that has a required stochiometry using CVD or ALD technique, one may need to form Ge, Sb or Te layer alternately followed by annealing. The thickness of each layer (Ge, Sb or Te) can be controlled so that a desired stochiometry ( e.g. 2,2,5 of Ge, Sb and Te) can be achieved in final product. Among these three layers, e.g., Ge, Sb and Te, Te may be the most difficult one to form. Currently available methods to form Te films either need high deposition temperature or plasma assist. However, either from materials and device performance or manufacturing cost, it is always preferred that the deposition can be performed at low temperature and without plasma assistance.

Hydrogen telluride has been used to prepare metal telluride, such as mercury telluride and cadmium telluride, as semiconductor materials. Dialkyltellurides are also used to make these materials.

Recently, the development of phase change memory has required the proper tellurium precursors for ALD or CVD deposition of GST films at relatively low temperature. Dialkytelluride and diaminotellurides have been used. However, these precursors have low reactivity toward the deposition reaction. Sometimes it results low tellurium content in the films than required stoichiometrical composition.

Synthesis of bis(trialkylsilyl)tellurium has been reported, as has synthesis of other silyltellurium compounds: (Me3Si)3SiTeH.

This invention discloses methods to form thin Te films and GST films using chemical vapor deposition methods at low temperatures.

BRIEF SUMMARY OF THE INVENTION

In one aspect, this invention discloses a method to form GST films and Te films using a CVD process at a temperature between 80° C. and 500° C. The Ge, Sb and Te precursors are selected from the group consisting of:

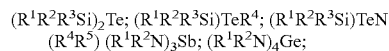

where $R^{1-5}$ are individually an alkyl group or alkenyl group with 1 to 10 carbons as chain, branched, or cyclic, or an aromatic group.

GST films are deposited from tellurium generated by the reaction of selected silyltellurium compounds with alcohols with a general formula of ROH, where R is an alkyl group with 1 to 10 carbon atoms in a linear, branched, or cyclic form, or an aromatic group, and the consequential reactions with selected aminogermanes and aminoantimony.

In another aspect, this invention discloses a method to form GST films using an ALD process at a temperature between 80° C. and 500° C. The Ge, Sb and Te precursors are selected from the group consisting of:

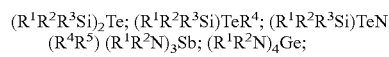

where $R^{1-5}$ are individually an alkyl group or alkenyl group with 1 to 10 carbons as chain, branched, or cyclic, or an aromatic group.

GST films are deposited from tellurium generated by the reaction of selected silyltellurium compounds with alcohols with a general formula of ROH, where R is an alkyl group with 1 to 10 carbon atoms in a linear, branched, or cyclic form, or an aromatic group, and the consequential reactions with selected aminogermanes and aminoantimony.

In another aspect, this invention discloses a method to form GST films using a cyclic CVD process at a temperature between 80° C. and 500° C. The Ge, Sb and Te precursors are selected from the group consisting of:

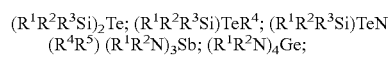

where $R^{1-5}$ are individually an alkyl group or alkenyl group with 1 to 10 carbons as chain, branched, or cyclic, or an aromatic group.

GST films are deposited from tellurium generated by the reaction of selected silyltellurium compounds with alcohols with a general formula of ROH, where R is an alkyl group with 1 to 10 carbon atoms in a linear, branched, or cyclic form, or an aromatic group, and the consequential reactions with selected aminogermanes and aminoantimony.

DETAILED DESCRIPTION OF THE INVENTION

The present invention relates to methods of forming thin Te films and GST films. The methods involves two aspects, selection of the Te based precursors, and the deposition techniques to form GST films using Te precursor and other precursors. The depositions are performed at 80° C. to 500° C., preferably 100° C. to 400° C., more preferably 100° C. to 200° C., most preferably 100° C. to 150° C.
The Te Precursors.

The tellurium precursors can be selected from disilyltellurium, silylalkyltellurium, silylaminotellurium with the general structures of:

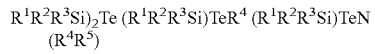

where $R^1$, $R^2$, $R^3$, $R^4$, and $R^5$ are independently hydrogen, alkyl groups having 1-10 carbons in linear, branched, or cyclic forms without or with double bonds, or aromatic groups.

Silyltellurium compounds are highly reactive to alcohols or water. These reactions can take place at room temperature or elevated temperature, resulting the generation of elemental tellurium

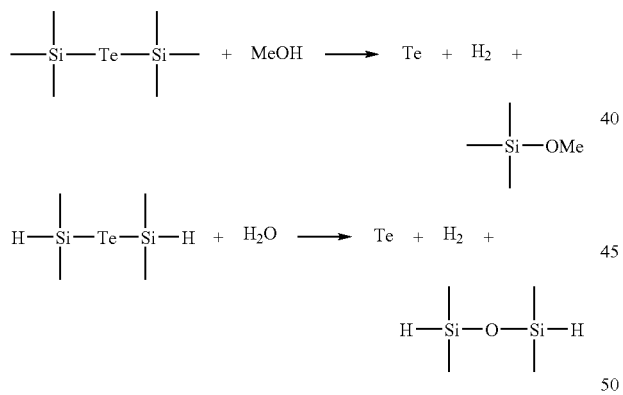

In an ALD process, the tellurium precursors, alcohols, germanium and antimony precursors, such as $(Me_2N)_4Ge$ and $(Me_2N)_3Sb$ are introduced to a deposition chamber in any sequence in a cyclic manner by vapor draw or direct liquid injection (DLI). The deposition temperature is preferably between 80° to 500° C.

The ALD reaction can be illustrated by the following scheme:

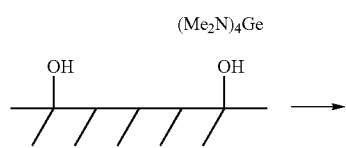

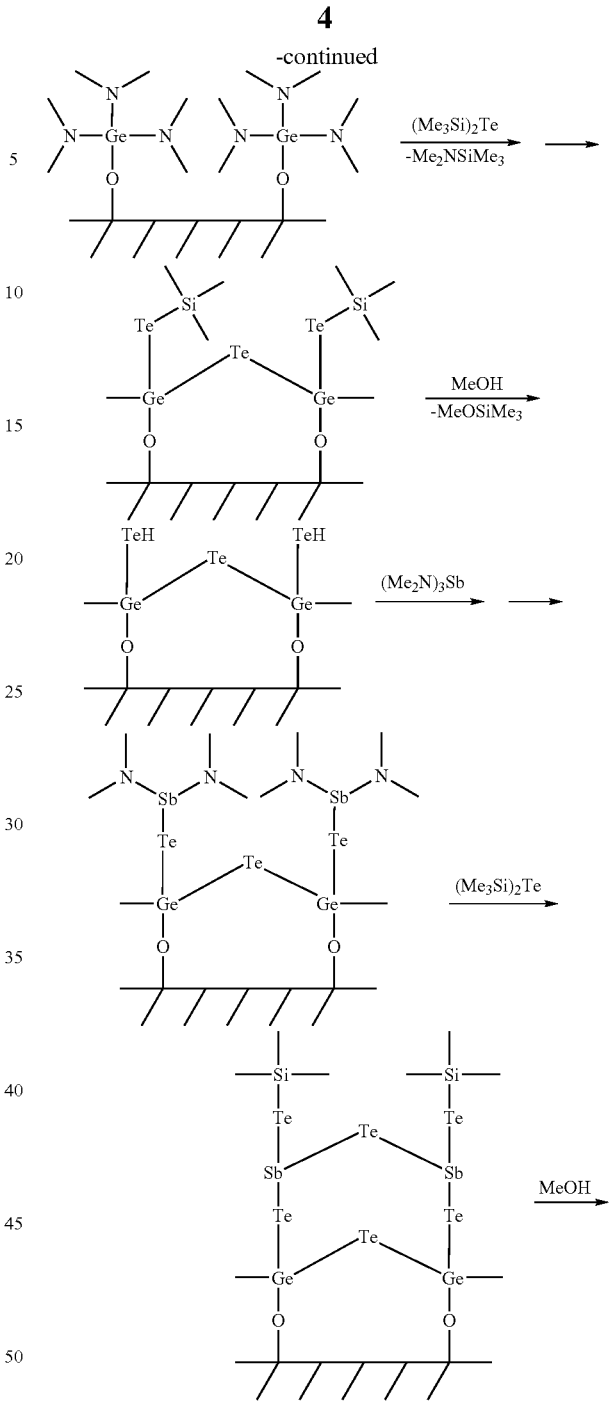

Step 1. Tetrakis(dimethylamino)germane is introduced and forms a molecular layer of aminogermane on the surface of the substrate.

Step 2. Hexamethyldisilyltellurium reacts with aminogermane layer to form Te—Ge bonds with elimination of dimethylaminotrimethylsilane. A Te layer with silyl substituents is formed.

Step 3. Methanol reacts with remaining silyl groups on tellurium layer to form Te—H bonds and volatile byproduct methoxytrimethylsilane, which is removed by purge.

Step 4. Tris(dimethylamino)stibane is introduced and forms antimony layer on the top of tellurium layer.

Step 5. Hexamethyldisilyltellurium is introduced again and forms tellurium layer.

Step 6. Methanol is introduced again to remove silyl groups on the tellurium.

An ALD cycle is then completely repeated, potentially many times, until the desired film thickness is achieved. The next cycle starts with Step 1, again, etc.

The silyltellurium compounds used in this process have the general structures:

$(R^1R^2R^3Si)_2Te; (R^1R^2R^3Si)TeR^4;$ and $(R^1R^2R^3Si)TeN(R^4R^5)$ where $R^1, R^2, R^3, R^4$ and $R^5$ are individually hydrogen, alkyl groups with 1 to 10 carbons in linear, branched, or cyclic form, or aromatic groups.

Aminogermanes and aminoantimony used in this process have the general formula:

$(R^1R^2N)_4Ge$ $(R^1R^2N)_3Sb$ where $R^1$ and $R^2$ are individually alkyl groups with 1 to 10 carbons in linear, branched, or cyclic form.

Alcohols used in this process have the general formula:

ROH where R is an alkyl group with 1 to 10 carbons in linear, branched, or cyclic form.

The Film Deposition

Figure 1:
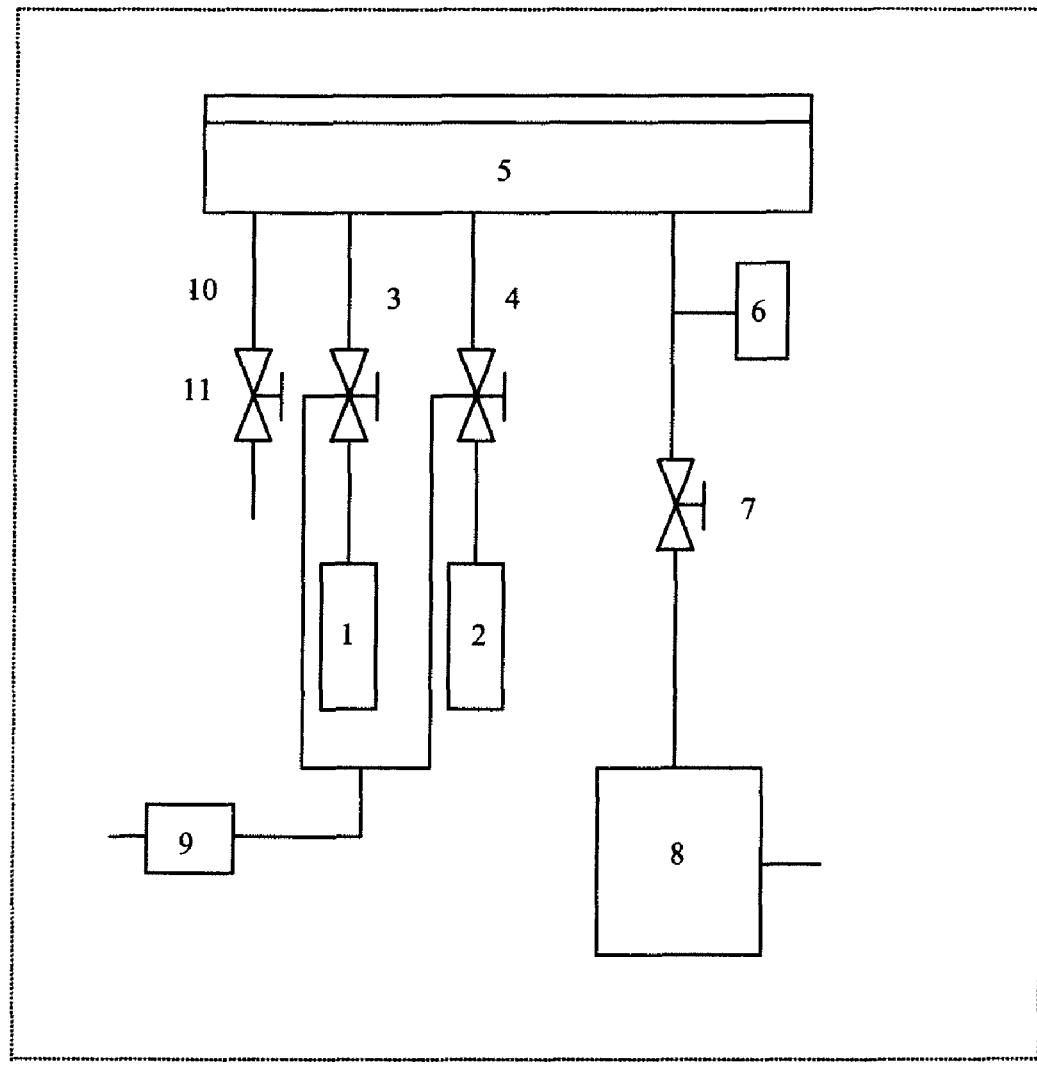
FIG. 1. The schematic of deposition apparatus.

The method described in this invention can be demonstrated using a thin film deposition apparatus illustrated in FIG. 1. The apparatus consists of the following parts:

A reactor 5 where a substrate is placed, precursor vapors react and form films. The reactor walls and substrate holder can be heated at the same or different temperatures;

liquid or solid precursor containers 1 and 2. The containers may also be heated if needed;

the valves 3 and 4 that may switch on or off the vapor flows to the reactor from the precursor containers. A mass flow controller (MFC) unit is used to control when and how much valves 3 and 4 switch;

the vacuum pump 8 that pumps out air or precursor vapors from the reactor. A valve 7 switches on/off the pumping line;

a vacuum gauge 6 that measures the pressure level within the reactor;

an inert gas (Ar or $N_2$) 10 that switches on or off via valve 11.

Before the deposition begins, the reactor 5 is filled with inert gas (e.g., Ar or $N_2$) through inlet 10 and then pumped out using a vacuum pump 8 to a vacuum level below 20 mTorr. The reactor is then filled with inlet gas again and the reactor wall and substrate holder are heated to a temperature between 80° C. to 500° C. at which the deposition is set to begin.

The Te precursor is delivered from precursor container 1 that is heated to a temperature between 30° C. to 100° C. The temperature remains constant during the deposition. The MeOH precursor is delivered from precursor container 2 that is heated to a temperature between 20° C. to 50° C. The temperature also remains a constant during the deposition.

A CVD process to form Te film is as follows:
Feed Te precursor vapor to the reactor by opening valve 3;
Close the valve 3 to stop Te vapor from entering the reactor;
Feed MeOH vapor to the reactor by opening valve 4;
Close the valve 4 to stop MeOH vapor from entering the reactor;
Te precursor vapor reacts with MeOH vapor within the reactor to form Te film on a substrate.
An ALD process to form Te film is as follows:
Close the reactor to vacuum pump 8 by closing valve 7;
Feed Te precursor vapor to the reactor a pulse of 0.1 seconds to 2 seconds by switching and off valve 3;
Feed Ar or $N_2$ into the reactor through line 10 and purge the reactor for 0.1 to 5 seconds by pumping out Ar or $N_2$ using vacuum pump 8;
Close the reactor to vacuum pump 8 by closing valve 7;
Feed MeOH precursor vapor to the reactor a pulse of 0.01 seconds to 0.1 seconds by switching and off valve 4;
Feed Ar or $N_2$ into the reactor through line 10 and purge the reactor for 0.1 to 5 seconds by pumping out Ar or $N_2$ using vacuum pump 8;
Close the reactor to vacuum pump 8 by closing valve 7;
Repeat the above steps from many times. The number of the cycles is preset according to the film thickness that is predetermined.
A cyclic CVD process to form Te film is as follow:
Close the reactor to vacuum pump 8 by closing valve 7;
Feed Te precursor vapor to the reactor a pulse of 2 seconds to 20 seconds by switching and off valve 3;
Feed MeOH precursor vapor to the reactor a pulse of 0.2 seconds to 10 seconds by switching and off valve 4;
Pump the reactor by opening valve 7 using vacuum pump 8;
Repeat the above steps from many times. The number of the cycles is preset according to the film thickness that is predetermined.

The GST (Ge—Sb—Te) films are formed by repeating the processes for Ge and Sb, respectively. The processes for the growth of Ge and Sb are similar to that for Te.

Example 1

Synthesis of Hexamethyldisilyltellurium 1.28 g (0.01 mol) 200 mesh tellurium powder, 0.48 g (0.02 mol) lithium hydride, and 40 ml tetrahydrofuran (THF) were placed in a 100 ml flask. With stirring, the mixture was refluxed for 4 hours. All black powder of tellurium disappeared, and a muddy color precipitate was formed. Then, the mixture was cooled down to −20° C.; 2.2 g (0.02 mol) trimethylchlorosilane was added. The mixture was allowed to warm up to room temperature. After stirring for 4 hours, the mixture was filtered under inert atmosphere. The solvent was removed by distillation. Hexamethyldisilyltellurium was purified by vacuum distillation, b.p. 50° C. at 2.5 mmHg.

Example 2

Synthesis of Tetramethyldisilyltellurium 3.84 g (0.03 mol) 200 mesh tellurium powder, 1.38 g (0.06 mol) sodium, 0.77 h (0.006 mol) naphthalene, and 50 ml THF were placed in a 100 ml flask. The mixture was stirred at room temperature for 24 hours. All black powder of tellurium and sodium disappeared, and a muddy color precipitate was formed. Then, the mixture was cooled down to −20° C.; 5.77 g (0.06 mol) dimethylchlorosilane was added. The mixture was allowed to warm up to room temperature. After stirring for 4 hours, the mixture was filtered under inert atmosphere. The solvent was removed by distillation. Tetramethyldisilyltellurium was purified by vacuum distillation, B.P. 50° C. at 4 mmHg.

Example 3

Synthesis of Trimethylsilyl-t-butyltellurium 6.4 g (0.05 mol) 200 mesh tellurium powder, 100 ml diethyl ether, and 20 ml 2.5 M t-butyllithium in hexane were added to a 250 ml flask. At 0° C., the mixture was stirred for 8 hours. All black powder of tellurium disappeared, and a muddy color precipitate was formed. To this mixture, 5.4 g (0.05 mol) trimethylchlorosilane was added. The mixture was allowed to warm up to room temperature. After stirring for 1 hour, the mixture was filtered under inert atmosphere. The solvent was removed by distillation. Trimethylsilyl-t-butyl-tellurium was purified by vacuum distillation.

Example 4

Synthesis of
Di-isopropylaminotrimethylsilyltellurium

A solution of 5.05 g (0.05 mol) di-isopropylamine in 50 ml THF was cooled to −20° C. 20 ml of 2.5M n-butyllithium in hexane was added. After the reaction mixture was warmed to room temperature, 6.4 g (0.05 mol) 200 mesh tellurium powder was added. The mixture was stirred at room temperature for 24 hours. All black powder of tellurium disappeared, and a muddy color precipitate was formed. Then, the mixture was cooled down to −20° C.; 5.4 g (0.05 mol) trimethylchlorosilane was added. The mixture was allowed to warm up to room temperature. After stirring for 4 hours, the mixture was filtered under inert atmosphere. The solvent was removed by distillation. Di-isopropylaminotrimethylsilyltellurium was purified by vacuum distillation.

Example 5

Generation of Elemental Tellurium 0.05 g hexamethyldisilyltellurium was placed on the bottom of a 100 ml pyrex glass flask filled with nitrogen and fitted with a rubber septem. 0.1 g of methanol was added slowly with a syringe. A shiny black film stared to deposit inside the glass wall of the flask. After a few minutes the entire flask interior was coated with a black tellurium film.

Example 6

Deposition and Characterization of Te Film

Thin films of Te were deposited using the method described in this invention. Specifically, hexamethyldisilyltellurium and methanol were used as precursors to form pure Te film. Since TiN is typically used for metal contacts in GST memory cells, the Si (100) wafers coated with 100 nm TiN film by sputtering technique were used as the substrates for Te film deposition. The container for Te precursor (hexamethyldisilyltellurium) was heated to a temperate at 50° C., while the container for methanol was kept at 20° C. The substrate temperature during the deposition was kept at 100° C. The deposition reactor was first pumped down to a base pressure of about 2 mT, followed by flashing nitrogen at least five times to remove any residual gases in the reactor. A working pressure of 20 mT was maintained within the deposition reactor during the deposition. The flow rate of the hexamethyldisilyltellurium was kept at 0.06 g/min, while the flow rate of methanol was kept at 0.4 g/min.

Figure 2:
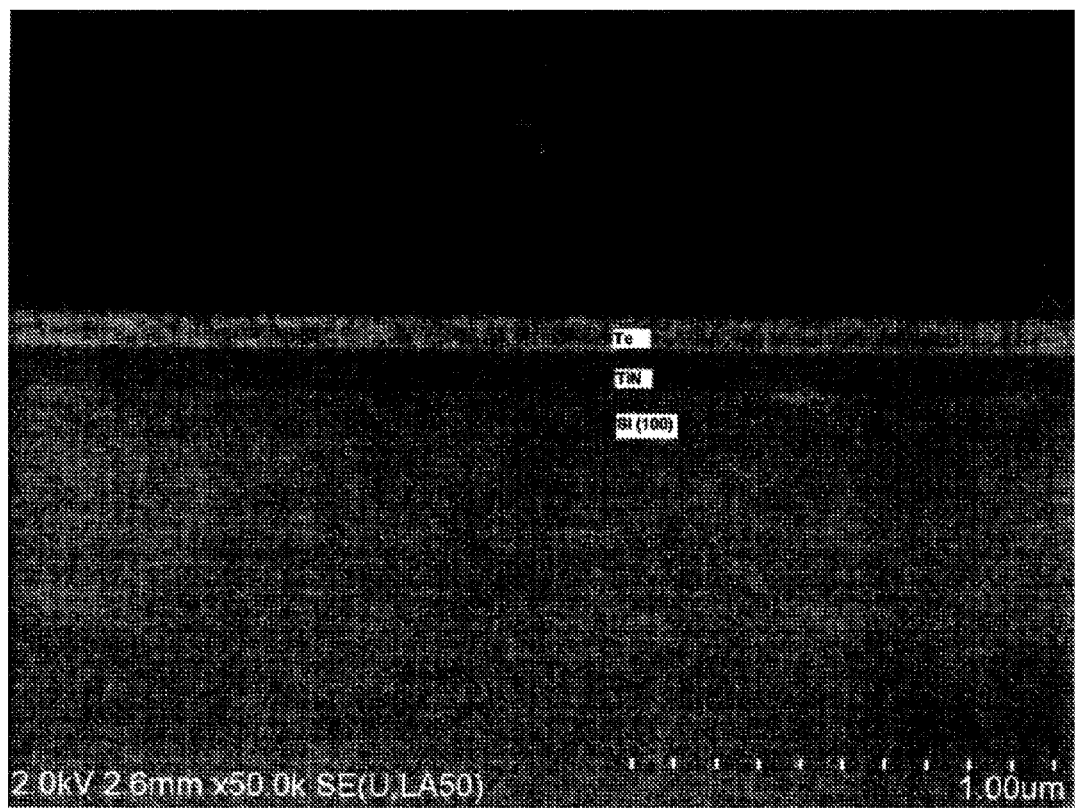
FIG. 2. FESEM view of a Te film cross section.

After the deposition was complete, the film was inspected using a field emission electron scanning microscope (FESEM) for its thickness and morphology. The SEM work was performed using a Hitachi S-4800 field emission SEM operating at 2 kV accelerating voltage for SEM. The images were collected using the upper secondary electron detector which produces the best resolution. A typical cross section view of the Te film deposited as described above is shown in FIG. 2. As can be seen from FIG. 2, about 80 nm thick Te film is formed on TiN layer which is between Si(100) substrate and Te film. The Te film is also very uniform.

The invention claimed is:

1. A method of depositing tellurium - containing film on a semiconductor substrate, comprising
   a. providing a tellurium precursor to the semiconductor substrate, the tellurium precursor selected from the group consisting of $(R^1R^2R^3Si)_2Te$; $(R^1R^2R^3Si)TeR^4$; and $(R^1R^2R^3Si)TeN(R^4R^5)$, where $R^1, R^2, R^3, R^4$ and $R^5$ are individually hydrogen, alkyl groups with 1 to 10 carbons in linear, branched, or cyclic form, or an aromatic group;
   b. providing an alcohol to the semiconductor substrate to react with the tellurium precursor to form a tellurium layer; and,
   c. maintaining a deposition temperature from 80° C. to 500° C.

2. The method of claim 1 in which an antimony precursor, selected from the group consisting of $(R^1 R^2N)_3Sb$, where $R^1$ and $R^2$ are individually alkyl groups with 1 to 10 carbons in chain, branched, or cyclic form, is provided to the semiconductor substrate and reacts with the tellurium-containing film and thereby forming a antimony-tellurium-containing film.

3. The method of claim 2 in which a germanium precursor selected from a group consisting with $(R^1 R^2N)_4Ge$, where $R^1$ and $R^2$ are individually alkyl groups with 1 to 10 carbons in chain, branched, or cyclic form, is provided to the semiconductor substrate and reacts with the antimony-tellurium-containing film and thereby forming a germanium-antimony-tellurium ternary film.

4. The method of claim 1 in which a germanium precursor selected from a group consisting with $(R^1 R^2N)_4Ge$, where $R^1$ and $R^2$ are individually alkyl groups with 1 to 10 carbons in chain, branched, or cyclic form, is provided to the semiconductor substrate and reacts with the tellurium-containing film and thereby forming a germanium-tellurium-containing film.

5. The method of claim 1 in which the alcohol has a general formula of ROH, where R is an alkyl group with 1 to 10 carbon atoms in a linear, branched, or cyclic form, or an aromatic group.

6. The method of claim 1 in which the alcohol has a general formula of ROH, where R is an alkyl group with 1 to 10 carbon atoms in a linear, branched, or cyclic form, or an aromatic group.

7. A method of forming germanium-antimony-tellurium film using atomic layer deposition on a semiconductor substrate in a reactor, comprising;
   a. providing a tellurium precursor to the semiconductor substrate, the tellurium precursor selected from the group consisting of $(R^1R^2R^3Si)_2Te$; $(R^1R^2R^3Si)TeR^4$; and $(R^1R^2R^3Si)TeN(R^4R^5)$, where $R^1, R^2, R^3, R^4$ and $R^5$ are individually hydrogen, alkyl groups with 1 to 10 carbons in linear, branched, or cyclic form, or an aromatic group;
   b. purging the reactor with inert gas;
   c. providing an alcohol to the reactor to react with the tellurium precursor to form a tellurium layer on the semiconductor substrate;
   d. purging the reactor with inert gas;
   e. providing an antimony precursor, selected from the group consisting of $(R^1 R^2N)_3Sb$, where $R^1$ and $R^2$ are individually alkyl groups with 1 to 10 carbons in chain, branched, or cyclic form, to the reactor to form an antimony layer;
   f. purging the reactor with inert gas;

g. providing a germanium precursor selected from a group consisting with $(R^1 R^2N)_4Ge$, where $R^1$ and $R^2$ are individually alkyl groups with 1 to 10 carbons in chain, branched, or cyclic form, to the reactor to form a germanium layer;

h. purging the reactor with inert gas and, i. repeating the steps a through step h to change thickness of germanium-antimony-tellurium film.

8. The method of claim 7 wherein steps a through d are repeated two or more times before steps e through h.

9. The method of claim 7 wherein steps a through d are conducted first.

10. The method of claim 7 wherein steps e through f are conducted first.

11. The method of claim 7 wherein steps g through h are conducted first.

12. A method of forming germanium-antimony-tellurium film using chemical vapor deposition on a semiconductor substrate in a reactor, comprising;

a. providing a tellurium precursor to the semiconductor substrate, the tellurium precursor selected from the group consisting of $(R^1R^2R^3Si)_2Te$; $(R^1R^2R^3Si)TeR^4$; and $(R^1R^2R^3Si)TeN(R^4R^5)$, where $R^1, R^2, R^3, R^4$ and $R^5$ are individually hydrogen, alkyl groups with 1 to 10 carbons in linear, branched, or cyclic form, or an aromatic group;

b. purging the reactor with inert gas for 0.1 to 1 second;

c. providing an alcohol to the reactor to react with the tellurium precursor to form a tellurium layer on the semiconductor substrate;

d. purging the reactor with inert gas for 0.1 to 1 second;

e. providing an antimony precursor, selected from the group consisting of $(R^1 R^2N)_3Sb$, where $R^1$ and $R^2$ are individually alkyl groups with 1 to 10 carbons in chain, branched, or cyclic form, to the reactor to form an antimony layer;

f. purging the reactor with inert gas for 0.1 to 1 second;

g. providing a germanium precursor selected from a group consisting with $(R^1 R^2N)_4Ge$, where $R^1$ and $R^2$ are individually alkyl groups with 1 to 10 carbons in chain, branched, or cyclic form, to the reactor to form a germanium layer; and, h. repeating the steps between step a and step g to change thickness of germanium-antimony-tellurium film.

13. The method of claim 12 in which the alcohol has a general formula of ROH, where R is an alkyl group with 1 to 10 carbon atoms in a linear, branched, or cyclic form, or an aromatic group.

14. The method of claim 12 wherein steps a through d are repeated two or more times before steps e through h.

15. The method of claim 12 wherein steps a through d are conducted first.

16. The method of claim 12 wherein steps e through f are conducted first.

17. The method of claim 12 wherein steps g through h are conducted first.

* * * * *